United States Patent [19]

Rosen

[11] 3,926,640

[45] Dec. 16, 1975

[54] PHOTOPOLYMERIZABLE COMPOSITIONS COMPRISING BENZOPHENONE REACTION PRODUCTS

[75] Inventor: George Rosen, Wayne, N.J.

[73] Assignee: Sun Chemical Corporation, New York, N.Y.

[22] Filed: Oct. 11, 1973

[21] Appl. No.: 405,517

Related U.S. Application Data

[63] Continuation-in-part of Ser. No. 200,174, Nov. 18, 1971, abandoned.

[52] U.S. Cl. ................ 96/115 P; 96/35.1; 96/84 R; 96/86 P; 96/87 R; 96/115 R; 117/93.31; 156/272; 204/159.23; 260/476 R

[51] Int. Cl.$^2$ ........................................... G03C 1/68

[58] Field of Search ............ 96/115 R, 115 P, 84 R; 204/159.14, 159.15, 159.23

[56] References Cited

UNITED STATES PATENTS

| | | | |
|---|---|---|---|
| 3,261,686 | 7/1966 | Celeste et al. | 96/115 P |
| 3,574,617 | 4/1971 | Skoultchi | 96/35.1 |

*Primary Examiner*—Ronald H. Smith
*Attorney, Agent, or Firm*—Cynthia Berlow

[57] ABSTRACT

Compounds containing a benzophenone or a substituted benzophenone moiety are (a) autophotopolymerizable, (b) photopolymerizable in compositions with another photoinitiator, or (c) photoinitiating in compositions with another photopolymerizable material.

6 Claims, No Drawings

PHOTOPOLYMERIZABLE COMPOSITIONS COMPRISING BENZOPHENONE REACTION PRODUCTS

This application is a continuation-in-part of copending application Ser. No. 200,174 (filed Nov. 18, 1971), now abandoned.

This invention relates to photopolymerizable compounds and compositions. More particularly it relates to compounds having built-in sensitizers which are autophotopolymerizable or which may be used as photoinitiators for photopolymerizable monomers.

The use of photopolymerizable ethylenically unsaturated monomeric materials in coating compositions, adhesives, printing inks, and the like is known. It is also known that such monomeric materials are converted into polymers by the action of radiation and that they will polymerize at an improved rate when exposed to radiation in the presence of a photoinitiator and/or a photosensitizer.

There are, however, a number of disadvantages connected with the use of added photoinitiators or photosensitizers along with the monomer in a photopolymerizable system. In the first place, photoinitiators must be activatable by radiation, such as ultraviolet light, electron beam radiation, or gamma radiation. At the same time they must be inactive at ambient temperatures in order to secure the storage and handling stability of the compositions containing them. In addition, the photoinitiator must be compatible with the monomer and the other ingredients, if any, in the system; for example, the initiator may have only a limited solubility in the selected monomer, thus decreasing the speed of the photopolymerization which to some extent is proportional to the concentration of the initiator in the system. It is also possible for the presence of an initiator to limit the use of other additives in the composition, thus preventing the attaining of the physical properties required for optimum performance in the desired end use.

The photoinitiator can form undesirable by-products which are not bonded to the product polymer; the photosensitizer usually does not end up as part of the polymer chain. As a result, a product may be formed which, at least in part, may be leachable by solvents.

In addition, many photoinitiators are crystalline and precipitate on standing. Also, with the use of added photoinitiators there may exist problems of uniform dispersion, volatility, and migration of the initiating material.

It has now been found that certain compounds autopolymerize and copolymerize upon exposure to a source of radiation, that is, they photopolymerize in the absence of a photoinitiator at a rate comparable to, or in some cases better than, the speed of previously disclosed monomers in the presence of a photoinitiator.

Inks and coatings made from these materials are free of volatile solvents, hydrophobic, and dry almost instantaneously in air at ambient temperature when exposed to a source of radiation, thus eliminating the need for ovens and the need to work in an oxygen-free environment as well as avoiding the air pollution, fire hazards, odor, and so forth that accompany the use of coating, ink, and adhesive systems based on volatile solvents. The inks have excellent workability on offset printing presses. They form extremely hard and durable films on a wide variety of substrates, such as, for example, newsprint; coated paper stock; irregular, e.g., corrugated, board; metal, e.g., foils, meshes, cans, and bottle caps; woods; rubbers; polyesters, such a polyethylene terephthalate; glass; polyolefins, such as treated and untreated polyethylene and polypropylene; cellulose acetate; fabrics such as cotton, silk, and rayon; and the like. They exhibit no color change in the applied film when subjected to the required curing conditions, and they are resistant to flaking; smudging; salt spray; scuffing; rubbing; and the deteriorating effects of such substances as alcohols, oils, and fats. The adhesives made with these materials have particularly good bonding properties. In addition, the compounds and compositions withstand both heat and cold, making them useful, for example, in printing inks or coatings for containers that must be sterilized, e.g., up to about 150°C. under pressure, and/or refrigerated, e.g., at less than about −20°C.; and so forth.

In general the compounds of this invention are polyfunctional ethylenically unsaturated monomers and prepolymers containing a benzophenone or a substituted benzophenone moiety. As employed herein "polyfunctional ethylenically unsaturated" refers to compounds having two or more terminal or pendant ethylenic groups.

The novel compounds of this invention are prepared by reacting a polyfunctional polyethylenically unsaturated monomer or the like with a suitable carboxy-substituted benzophenone. Although the invention will be illustrated by use of compounds prepared from benzophenone tetracarboxylic dianhydride (BTDA), it is to be understood that this is only for purposes of demonstration and that the invention is equally applicable to compounds prepared from other carboxy-substituted benzophenones, such as benzoylbenzoic acid, o-(p-chlorobenzoyl) benzoic acid, o-(p-dimethylaminobenzoyl) benzoic acid, benzophenone dicarboxylic acids, benzophenone tricarboxylic acids, benzophenone tetracarboxylic acids, benzophenone pentacarboxylic acids, and benzophenone hexacarboxylic acids; the corresponding anhydrides; and substituted benzophenone mono-and polycarboxylic acids and anhydrides having the following formula:

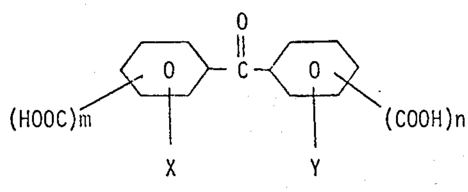

wherein $m$ and $n$ is each an integer from 0 to 3 and the sum of $m$ and $n$ is in the range of 1 to 6; and X and Y may each be 1 to 4 halogen atoms, e.g., chlorine, bromine, or iodine; dialkylamino groups having 1 to 4 carbon atoms; or other groups which confer desirable properties to the product, such as for example mercaptan, disulfide, alkene, peroxy, alkoxy, carbonyl, amide, amine, nitro, hydroxy, ether, aryl, or the like; X and Y may be the same or different and either or both may be omitted. Such acids and anhydrides are known in the art and may be obtained commercially or prepared by any known and convenient method.

In accordance with this invention, carboxy-substituted benzophenones are reacted with hydroxyl-containing polyethylenically unsaturated esters, resulting in compounds that have built-in sensitizers and are useful for printing inks, coating compositions, adhesives, and the like with or without a secondary sensitizer.

The carboxy-substituted benzophenones may be reacted, for example, with monomeric polyfunctional hydroxyl-containing esters or modified monomeric polyfunctional esters, that is, monomers and prepolymers, i.e., dimers, trimers, and other oligomers or mixtures or copolymers thereof, generally described as the acrylic acid, methacrylic acid, itaconic acid, and the like, esters of aliphatic polyhydric alcohols such as for example the di- and polyacrylates, the di- and polymethacrylates, and the di- and polyitaconates of ethylene glycol, triethylene glycol, tetraethylene glycol, tetramethylene glycol, trimethylolethane, trimethylolpropane, butanediol, pentaerythritol, dipentaerythritol, tripentaerythritol, other polypentaerythritols, sorbitol, d-mannitol, diols of unsaturated fatty acids, and the like.

Typical compounds include, but are not limited to, trimethylolpropane diacrylate, trimethylolethane diacrylate, trimethylolpropane dimethacrylate, trimethylolethane dimethacrylate, tetramethylene glycol monomethacryalte, ethylene glycol monomethacrylate, triethylene glycol monomethacrylate, tetraethylene glycol monoacrylate, tetraethylene glycol monomethacrylate, pentaerythritol diacrylate, pentaerythritol triacrylate, pentaerythritol-3.5-acrylate, dipentaerythritol diacrylate, dipentaerythritol triacrylate, dipentaerythritol tetraacrylate, dipentaerythritol pentaacrylate, tripentaerythritol hexacrylate, pentaerythritol dimethacrylate, pentaerythritol trimethacrylate, dipentaerythritol dimethacrylate, dipentaerythritol tetramethacrylate, tripentaerythritol heptamethacrylate, pentaerythritol diitaconate, dipentaerythritol trisitaconate, dipentaerythritol pentaitaconate, dipentaerythritol-5.5-itaconate, ethylene glycol monomethacrylate, 1,3-butanediol monoacrylate, 1,3-butanediol monomethacrylate, 1,4-butanediol monoitaconate, sorbitol pentaacrylate, sorbitol-5.5-acrylate, isocyanate-modified esters such as are disclosed in U.S. Pat. No. 3,759,809, which issued on Sept. 18, 1973, and the like, and mixtures and prepolymers thereof having a finite amount of free hydroxyl groups.

These products having a built-in sensitizer may be prepared in any known and convenient manner, for example by reacting the hydroxyl-containing ester with the carboxy-substituted benzophenone in an amount whereby the equivalents of the acid or anhydride are roughly equal to the equivalents of the hydroxy groups of the compound with which the carboxy-substituted benzophenone is reacted at a temperature of about 50° to 150°C., and preferably about 70° to 110°C., although these conditions are not critical. In general the molar ratio of the hydroxyl groups to the acid or anhydride is in the range of about 1:1 to about 5:1.

The photocuring speed of the reaction is influenced by the amount of the benzophenone or substituted benzophenone moiety in the product. For the purposes of this invention, the amount of the moiety is in general about 5 to 50, and preferably equivalent to about 15 to 40, percent by weight of the product.

While the novel products of this invention may photopolymerize at satisfactory rates in the absence of photoinitiating additives, their photocuring rates can be increased by the addition thereto of another photoinitiator. Examples of suitable photoinitiators include the following; acyloins, such as benzoin; acyloin derivatives, such as benzoin methyl ether, benzoin ethyl ether, desyl bromide, desyl chloride, desyl amine, and the like; ketones, such as benzophenone, acetophenone, ethyl methyl ketone, cyclopentanone, benzil, caprone, benzoyl cyclobutanone, dioctyl acetone, and the like; substituted benzophenones such as Michler's ketone; quinones and polynuclear quinones, such as naphthoquinone and anthraquinone; substituted polynuclear quinones; halogenated aliphatic, alicyclic, and aromatic hydrocarbons and their mixtures in which the halogen may be chlorine, bromine, fluorine, or iodine; and the like; and mixtures thereof. Examples of halogenated photoinitiators include polyhalogenated hydrocarbons, such as polyfluorinated phenyls (E.I. duPont deNemours & Co.); chlorinated rubbers, such as the Parlons (Hercules Powder Company); copolymers of vinyl chloride and vinyl isobutyl ether, such as Vinoflex MP-400 (BASF Colors and Chemicals, Inc.); chlorinated aliphatic waxes, such as Chlorowax 70 (Diamond Alkali, Inc.); perchloropentacyclodecane, such as Dechlorane+ (Hooker Chemical Co.); and Unichlor-70B (Neville Chemical Co.); mono- and polychlorobenzenes; mono- and polybromobenzenes; mono- and polychloroxylenes; mono- and polybromoxylenes; dichloromaleic anhydride; 1-(chloro-2-methyl) naphthalene; 2, 4-dimethylbenzene sulfonyl chloride; 1-bromo-3- (m-phenoxyphenoxy benzene); 2-bromoethyl methyl ether; chlorendic anhydride; chloromethylnaphthyl chloride; chloromethyl naphthalene; bromomethyl phenanthrene; diiodomethyl anthracene; hexachlorocyclopentadiene; hexachlorobenzene; and the like; and mixtures thereof. When a photoinitiator is used, the ratio of the amount of the benzophenone derivative to the photoinitiator is generally about 99:1 to about 10:90 and preferably from about 30:70 to about 70:30.

In addition to being photopolymerizable in the absence or the presence of other photosensitizers, the novel compounds of this invention may themselves be used as photosensitizers, speeding up the curing rate of a variety of polyethylenically unsaturated esters, such as those listed above, modifications of these esters, and their mixtures. The compounds of this invention may be used alone as photosensitizers or they may be used along with at least one other photosensitizing additive. When used as photosensitizers, the compounds of this invention are used in a ratio to the polyethylenically unsaturated monomer of about 1:99 to about 90:10, and preferably from about 30:70 to about 70:30.

When used in combination with a second initiator or sensitizer, such as are listed above, about 0.1 to 10 parts by weight of the secondary initiator per 100 parts of the carboxy-substituted benzophenone derivative are used.

Commonly known modifiers may be incorporated into the formulations using these compounds and compositions, including plasticizers; wetting agents for the colorant, such as dichloromethylstearate and other chlorinated fatty esters; leveling agents, such as lanolin, paraffin waxes, and natural waxes; and the like. Such modifiers are generally used in amounts ranging up to about 3 percent by weight, and preferably about 1 percent, based on the total weight of the formulation.

The formulations may be prepared in any convenient manner, such as, for example in a three-roll mill, a sand mill, a ball mill, a colloid mill, or the like, in accordance with known dispersion techniques.

Variables which determine the rate at which a radiation-curable compound or composition will dry include the nature of the substrate, the specific ingredients in the composition, the concentration of the photoinitiator, the thickness of the material, the nature and intensity of the radiation source and its distance from the material, the presence or absence of oxygen, and the temperature of the surrounding atmosphere and of the substrate. Irradiation may be accomplished by any one or a combination of a variety of methods. The composition may be exposed, for example, to actinic light from any source and of any type as long as it furnishes an effective amount of ultraviolet radiation, since the compositions activatable by actinic light generally exhibit their maximum sensitivity in the range of about 1800 A. to 4000 A., and preferably about 2000 A. to 3000 A.; electron beams; gamma radiation emitters; and the like; and combinations of these. Suitable sources include, but are not limited to, carbon arcs, mercury-vapor arcs, fluorescent lamps with special ultraviolet light-emitting phosphors, argon glow lamps, photographic flood lamps, and so forth.

The time of irradiation must be sufficient to give the effective dosage. Irradiation may be carried out at any convenient temperature, and most suitably is carried out at room temperature for practical reasons. Distances of the radiation source from the work may range from about ⅛ inch to 10 inches, and preferably about ⅛ inch to 6 inches.

The compounds and compositions of the present invention are suitable for use in the absence of volatile solvents and in the presence of oxygen as vehicles for paints, lacquers, and printing inks which are capable of setting or hardening by exposure to radiation. They are suitable also as compositions and elements for the preparation of photographic images, printing plates, and rolls; as adhesives for foils, films, papers, fabrics, and the like; as coatings for metals, plastics, paper, wood foils, textiles, glass, cardboard, box board, and the like; as markers for roads, parking lots, air-fields, and similar surfaces; and so forth.

When used as vehicles for inks, e.g., printing inks, the compound may be pigmented with any of a variety of conventional organic or inorganic pigments, e.g., molybdate orange, titanium white, chrome yellow, phthalocyanine blue, and carbon black, as well as colored with dyes in a conventional amount. For example, the vehicle may be used in an amount ranging from about 20 to 99.9 percent and the amount of colorant may range from about 0.1 to 80 percent of the weight of the total composition.

Stock which may be printed includes paper, clay-coated paper, and box board. In addition, the compositions of the present invention are suitable for the treatment of textiles, both natural and synthetic, e.g., in vehicles for textile printing inks or for specialized treatments of fabrics to produce water repellency, oil and stain resistance, crease resistance, etc.

When the photopolymerizable materials of the present invention are used as adhesives, at least one of the substrates must be translucent or transparent when ultraviolet light is used. When the radiation source is an electron beam or gamma radiation, at least one of the substrates must be capable of transmitting high energy electrons or gamma radiation, respectively, and neither is necessarily translucent to light. Typical laminations include polymer-coated cellophane to polymer-coated cellophane films, polymer-coated cellophane to polypropylene, Mylar to metal substance such as aluminum or copper, polypropylene to aluminum, and the like.

The photopolymerizable compounds of the present invention may be utilized for metal coatings and particularly for metals which are to be subsequently printed. Glass and plastics may also be printed or coated, and the coatings are conventionally applied by roller or spray. Pigmented coating systems may be used for various polyester and vinyl films; glass; polymer-coated cellophane; treated and untreated polyehtylene, for example in the form of disposable cups or bottles; treated and untreated polypropylene; and the like. Examples of metals which may be coated include sized and unsized tin plate.

Photopolymerizable elements prepared from the materials of this invention comprise a support, e.g., a sheet or plate, having superimposed thereon a layer of the above-described radiation-curable material. Suitable base or support materials include metals, e.g., steel and aluminum plates; sheets; and foils; and films or plates composed of various film-forming synthetic resins or high polymers, such as addition polymers, and in particular vinyl polymers, e.g., vinyl chloride polymers; vinylidene chloride polymers; vinylidene chloride copolymers with vinyl chloride, vinyl acetate, or acrylonitrile; linear condensation polymers such as polyesters, e.g., polyethylene terephthalate; polyamides, etc. Fillers or reinforcing agents can be present in the synthetic resin or polymer bases. In addition, highly reflective bases may be treated to absorb ultraviolet light, or a light absorbtive layer can be transposed between the base and photopolymerizable layer.

Photopolymerizable elements can be made by exposing to radiation selected portions of the photopolymerizable layer thereof until addition polymerization is completed to the desired depth in the exposed portions. The unexposed portions of the layer are then removed, e.g., by the use of solvents which dissolve the monomer or prepolymer but not the polymer.

When a carboxy-substituted benzophenone-modified monomer is mixed with a photosensitizer that absorbs in the visible spectrum, e.g., one of the acyloin type such as benzoin, a clear liquid composition results which may be cast into any thickness; upon exposure to actinic or ultraviolet radiation, the cast composition will cure to a solid plastic which is suitable for use as a structural material, to encapsulate electrical components, and the like.

The compounds and compositions as described herein possess many advantages over the conventional oleoresinous and solvent-type inks and coatings. The substrate need not be pretreated or prepared in any way. The use of volatile solvents and the attendant hazards and odor are eliminated. The inks and coatings have excellent adhesion to the substrate after exposure to radiation. They have good gloss and rub-resistance and withstand temperatures as high as about 150°C. and as low as about −20°C. The printed or coated sheets can be worked and turned immediately after exposure to the energy source.

The invention and its advantages will be better understood with reference to the following illustrative examples, but it is not intended to be limited thereto. In the examples, the parts are given by weight unless otherwise specified. Unless otherwise indicated, when the ingredient is solid at room temperature, the mixture may be heated to melt the solid ingredient, but generally not above 100°C., or it may be used in a mixture with other liquid ingredients. The atmospheric and temperature conditions were ambient unless otherwise noted.

EXAMPLE I

A. A mixture of 747 parts of pentaerythritol-3.5-acrylate (1 equivalent OH) and 120 parts of benzophenone tetracarboxylic dianhydride (BTDA) was heated at 80°–90°C. in the presence of phosphoric acid as catalyst. The product was a half-ester adduct of the pentaerythritol-3.5-acrylate and BTDA.

B. The product of part (A) was coated onto a glass slide at a wet film thickness of 0.3 micron and irradiated at a distance of 2 inches from a 6-inch 1200-watt-/inch mercury vapor lamp. The film dried in 0.95 second.

C. To illustrate the use of the benzophenone-modified compound of part (A) as a photoinitiator, a solution of 30 parts of the product of part (A) in 70 parts of pentaerythritol tetraacrylate was applied in a thin film to corona-treated polyethylene film and laminated to vinylidene chloridecoated cellophane. The sample was exposed to a 200-watt/inch mercury vapor lamp for 0.2 second, causing complete cure of the adhesive and providing a laminate having excellent peel strength.

D. For comparative purposes a mixture of 90 parts of pentaerythritol-3.5-acrylate and 10 parts of benzophenone was dried as in part (B) above. The film dried in 25 seconds.

EXAMPLE 2

A mixture of 70 parts of the BTDA derivative of Example 1 (A) and 30 parts of polychlorinated triphenyl containing 60 weight percent of chlorine (Monsanto Chemical Co.'s polychlorinated hydrocarbon 5460) was prepared and dried to tack-free film in 0.6 second under the conditions of Example 1 (B).

EXAMPLE 3

A mixture of 30 parts of the product of Example 1 (A) and 70 parts of an isocyanate-modified pentaerythritol triacrylate (prepared by the process disclosed in U.S. Pat. No. 3,759,809, which issued on Sept. 18, 1973) dried by the process of Example 1 (B) in 6.5 seconds.

EXAMPLE 4

A mixture of 15 parts of the BTDA derivative of Example 1 (A), 70 parts of an isocyanate-modified pentaerythritol triacrylate, and 15 parts of Monsanto's polychlorinated hydrocarbon 5,460 dried to a tack-free film in 2.4 seconds under the conditions of Example 1 (B).

EXAMPLE 5

The procedures of Examples 1 (A) and 1 (B) were repeated with each of the following monomers instead of pentaerythritol-3.5-acrylate: trimethylolethane diacrylate, trimethylolpropane diacrylate, trimethylolpropane dimethacrylate, pentaerythritol trimethacrylate, pentaerythritol diitaconate, a mixture of dimers and trimers of pentaerythritol triacrylate, and sorbitol tetracrylate. The results were comparable.

EXAMPLE 6

The procedure of Examples 2 and 4 were repeated with each of the following initiators instead of Monsanto's polychlorinated hydrocarbon 5,460: chlorendic anhydride, Michler's ketone, benzil, benzoin methyl ether, acetophenone, and hexachlorobenzene. The results were comparable.

EXAMPLE 7

The prodecures of Examples 1 (A), 1 (B), and 1 (C) were repeated with each of the following instead of BTDA: 3,3', 4,4'-benzophenone tetracarboxylic acid, benzophenone dicarboxylic acid, benzophenone tetracarboxylic anhydride, benzophenone tetracarboxylic anhydride, N,N-dimethylaminobenzophenone tetracarboxylic acid, N,N-dichlorobenzophenone tetracarboxylic acid, benzophenone hexacarboxylic acid, and dibutylaminobenzophenone tetracarboxylic acid. The results were comparable

EXAMPLE 8

The procedure of Example 1 (C) was repeated with each of the following instead of pentaerythritol tetraacrylate: pentaerythritol-3.5-acrylate, trimethylolpropane dimethacrylate, isocyanate-modified trimethylolpropane dimethacrylate, and pentaerythritol diitaconate. The results were comparable.

EXAMPLE 9

The products of this invention were formulated into inks and tested as follows:

A mixture of 85 parts of the product of Example 1 (A) and 15 parts of phthalocyanine blue was printed onto coated paper by letterpress and dried by passing it under three 200-watt/inch mercury vapor lamps at the rate of 1,200 feet per minute.

EXAMPLE 10

The products of Examples 1 (A), 2, 3, 5, and 7 were applied by offset gravure at film weights ranging from 0.5 to 3.0 pounds per ream to each of these substrates: Saran-coated cellophane, polyethylene surface-treated with corona discharge, polyvinylidene dichloride-coated polypropylene, and Mylar. Laminations were made at 150°F. and 50 pounds/inch pressure between cellophane and cellophane, cellophane and polyethylene, cellophane and polypropylene, and polypropylene and Mylar, and then cured by exposing them at the rate of 50 feet per minute at a distance of 1 inch from a 1,200-watt/inch ultraviolet lamp. The laminations were successful as evidenced by tear seals having bond strengths of at least 300 grams per inch.

EXAMPLE 11

The procedure of Example 9 was repeated with each of the following colorants instead of phthalocyanine blue: lithol rubine red, carbon black, milori blue, and phthalocyanine green. The results were comparable.

EXAMPLE 12

A. A mixture of 252 parts of o-benzoylbenzoic acid (o-BBA), 83.6 parts of propylene glycol, and 20 parts of xylene was heated to 225°C. under nitrogen. The water of reaction was distilled off by xylene azeotrope, and the temperature was held at 225°–230°C. until the acid number was 2 (about 6 hours). The xylene was removed by vacuum distillation. The product, propylene glycol dibenzoyl benzoate, is a viscous liquid having an acid number of 1.2.

B. A mixture of 0.6 part of the product of part (A) and 10 parts of an isocyanate-modified pentaerythritol triacrylate (prepared by the process disclosed in U.S.

Pat. No. 3,759,809, issued Sept. 18, 1973.) was coated onto tin-free steel at a thickness of 0.001 inch and irradiated under a 100-watt/inch medium pressure mercury arc lamp. A hard cured film was obtained in 5 seconds.

EXAMPLES 13–16

Each of the following compounds was coated onto a glass slide at a wet film thickness of 0.3 micron and irradiated at a distance of 3 inches from a 200-watt-/inch mercury vapor lamp. The time required by each to develop resistance to finger nail scratch is listed below:

| Example | Compound | Cure Time, Seconds |
|---|---|---|
| 13 | bis(acryloxymethyl)ethyl-o-benzoyl benzoate | 12 |
| 14 | tris(acryloxymethyl)ethyl-o-benzoyl benzoate | 7 |
| 15 | tris(acryloxymethyl)ethyl-o-(p-chlorobenzoyl benzoate) | 1.3 |
| 16 | tris(acryloxymethyl)ethyl-o-(p-dimethylamino-benzoyl benzoate) | <0.1 |

By the process of Example 12, the compound of Example 13 was prepared from o-BBA and trimethylolethane triacrylate; the compound of Example 14 was prepared from o-BBA and pentaerythritol triacrylate; the compound of Example 15 was prepared from o-(p-chlorobenzoyl)benzoic acid and pentaerylthritol triacrylate; and the compound of Example 16 was prepared from o-(p-dimethylaminobenzoyl)benzoic acid and pentaerythritol triacrylate.

For comparative purposes compounds outside of the scope of this invention were tested in the same manner as above with the following results (cure time, seconds):

| | | |
|---|---|---|
| (a) | acryloxybutyl-o-benzoyl benzoate | 30 |
| (b) | lauryl acrylate | >60 |
| (c) | 1,4-butanediol diacrylate | 45 |
| (d) | pentaerythritol tetraacrylate | 31 |
| (e) | pentaerythritol tetraacrylate/benzophenone (90/10 mixture) | 23 |

Thus it can be seen that the products of the reaction of polyfunctional polyethylenically unsaturated esters with a carboxy-substituted benzophenone (Examples 13–16) cure considerably faster than the product of the reaction of monoethylenically unsaturated esters and o-BBA (a), mixtures of polyethylenically unsaturated esters and benzophenone (e), and mono- and polyethylenically unsaturated esters with benzophenone neither added nor built-in (b, c, and d).

EXAMPLE 17

The o-BBA derivatives of this invention were formulated into inks and tested as follows:

A. A mixture of 85 parts of tris(acryloxymethyl)ethyl-o-benzoyl benzoate and 15 parts of phthalocyanine blue was printed onto coated paper by letterpress and dried by passing it under three 200-eatt/inch mercury vapor lamps at the rate of 1,200 feet per minute.

B. A mixture of 68 parts of tris(acryloxymethyl)ethyl-o-benzoyl benzoate, 15 parts of phthalocyanine blue, and 17 parts of Monsanto's polychlorinated hydrocarbon 5,460 was printed by web offset onto 32-pound coated paper; the ink was dried by passing it under three 200-watt/inch mercury vapor lamps at the rate of 800 feet per minute.

In each case the sheets were set off free without the use of spray powders and were scratch resistant.

C. A mixture of 85 parts of a 30/66/4 mixture of propylene glycol dibenzoyl benzoate/an isocyanate-modified pentaerythritol triacrylate/4,4′-bis (dimethylamino) benzophenone and 15 parts of phthalocyanine blue was exposed at a distance of 2 inches from a 6-inch 1,200-watt/inch mercury vapor lamp and dried to a tack-free film in 0.7 second.

EXAMPLE 18

The procedures of Examples 14 and 17 were repeated with each of the following instead of pentaerythritol triacrylate; pentaerythritol-3.5-acrylate, trimethylolpropane dimethacrylate, isocyanate-modified trimethylolpropane dimethacrylate, and pentaerythritol diitaconate. The results were comparable.

EXAMPLE 19

To demonstrate the importance of using a polyethylenically unsaturated ester for the end uses for which the compositions of this invention are best suited, the procedures of parts (A) and (B) of Example 1, part (a) of Example 9, and Example 14 were repeated with each of the following monoethylenically unsaturated monomeric esters instead of the pentaerythritol triacrylate: hydroxyethyl acrylate, hydroxyethyl methacrylate, hydroxyproply methacrylate, and hydroxyhexyl acrylate. In each of these cases where the starting ester was monoethylenically unsaturated, the benzophenone-modified product was not acceptable because the speed of curing was too slow, the solution viscosity was too high, and the surface properties were poor.

EXAMPLE 20

The procedures of Examples 1 (B) and (C) and 2–18 were repeated except that instead of being exposed to ultraviolet light the samples were passed on a conveyor belt beneath the beam of a Dynacote 300,000-volt linear electron accelerator at a speed and beam current so regulated as to produce a dose rate of 0.5 megarad.

These systems produced resinous materials of varying degrees of hardness in films from 0.5 to 20 mils thick having tacky surfaces.

EXAMPLE 21

The procedures of Example 1 (B) and (C) and 2–18 were repeated except that instead of being exposec to ultraviolet light the samples were exposed to a combination of ultraviolet light and electron beam radiation in a variety of arrangements: ultraviolet, then electron beam; electron beam, then ultraviolet light; ultraviolet light before and after electron beam; electron beam beam before and after ultraviolet rediation; and simultaneous electron beam and ultraviolet light radiation. The results were comparable.

What is claimed is:

1. A photopolymerizable element comprising a support and a coating thereon consisting essentially of the product of the reaction of (1) a hydroxy-containing polyethylenically unsaturated ester or an isocyanate-modified hydroxy-containing polyethylenically unsaturated ester which is the product of the reaction of (a) an ethylenically unsaturated acid and (b) a polyhydric alcohol and (2) a monocarboxy-substituted benzophenone having the formula

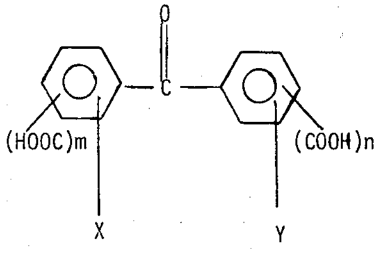

wherein $m$ and $n$ is each 0 or 1 and the sum of $m$ plus $n$ is 1; and X and Y is each 1 to 4 halogen atoms or dialkylamino groups having 1 to 4 carbon atoms; X and Y may be the same or different and either or both may be omitted.

2. A photopolymerizable composition comprising (A) a polyethylenically unsaturated ester and (B) a photoinitiator consisting of the product of the reaction of (1) a hydroxy-containing polyethylenically unsaturated ester or an isocyanate-modified hydroxy-containing polyethylenically unsaturated ester which is the product of the reaction of (a) an ethylenically unsaturated acid and (b) a polyhydric alcohol and (2) a monocarboxy-substituted benzophenone having the formula

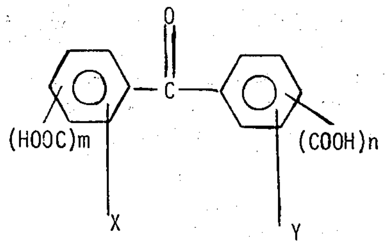

wherein $m$ and $n$ is each 0 or 1 and the sum of $m$ plus $n$ is 1; and X and Y is each 1 to 4 halogen atoms or dialkylamino groups having 1 to 4 carbon atoms; X and Y may be the same or different and either or both may be omitted.

3. The composition of claim 2 wherein the ester (A) is a di- or polyacrylate, a di- or polymethacrylate, or a di- or polyitaconate.

4. The composition of claim 2 wherein the ester (A) is an isocyanate-modified di- or polyacrylate, di- or polymethacrylate, or di- or polyitaconate.

5. The composition of claim 2 wherein the ratio of the amount of the ester (A) to the amount of the photoinitiator (B) is about 99:1 to 10:90.

6. The composition of claim 2 wherein the ratio of the amount of the ester (A) to the amount of the photoinitiator (B) is about 30:70 to 70:30.

* * * * *